US009722549B2

United States Patent
Lund et al.

(10) Patent No.: US 9,722,549 B2
(45) Date of Patent: Aug. 1, 2017

(54) PIXEL MASTER-SLAVE PHOTODIODE BIAS CONTROL AMPLIFIER

(71) Applicant: Sensors Unlimited, Inc., Princeton, NJ (US)

(72) Inventors: Joshua Lund, Dallas, TX (US); Minlong Lin, Plainsboro, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 126 days.

(21) Appl. No.: 14/684,121

(22) Filed: Apr. 10, 2015

(65) Prior Publication Data
US 2016/0300872 A1  Oct. 13, 2016

(51) Int. Cl.
H01J 40/14    (2006.01)
H03F 3/08    (2006.01)
H04N 5/369    (2011.01)

(52) U.S. Cl.
CPC ............. *H03F 3/08* (2013.01); *H04N 5/3698* (2013.01)

(58) Field of Classification Search
CPC ... H04N 5/369; H04N 5/353; H01L 27/14609
USPC .............. 250/208.1, 214 R, 214 A, 214 LA; 330/59, 110, 308
See application file for complete search history.

(56) References Cited

U.S. PATENT DOCUMENTS 9,223,441 B1 *  12/2015  Bohn ................... G06F 3/0421
2012/0104228 A1 *  5/2012  Souchkov .............. H04N 5/378
250/208.1

* cited by examiner

*Primary Examiner* — Kevin Pyo
(74) *Attorney, Agent, or Firm* — Snell & Wilmer L.L.P.

(57) ABSTRACT

A pixel master-slave photodiode bias control amplifier system is disclosed. The pixel master-slave photodiode bias control amplifier system may include a master pixel and one or more slave pixels. The slave pixel(s) may be connected to a portion of the master pixel. In this manner, components may be shared between/among the master pixel and the slave pixel(s); thus, for example, optimizing the component count of the pixel master-slave photodiode bias control amplifier system and the size occupied by the pixel master-slave photodiode bias control amplifier system.

14 Claims, 3 Drawing Sheets

PIXEL MASTER-SLAVE PHOTODIODE BIAS CONTROL AMPLIFIER

STATEMENT REGARDING GOVERNMENT RIGHTS

These inventions were made with government support under C-154-N00014-12-C-0375 awarded by the United States Office of Naval Research. The government has certain rights in these inventions.

FIELD

The present disclosure relates generally to systems and methods for pixel photodiode bias control amplifiers, and more specifically to master-slave pixels.

BACKGROUND

Pixel amplifiers are frequently used in image sensors to control the bias voltage of a photodiode. As image sensors are made smaller and pixel pitches are reduced, the area overhead associated with the transistors that comprise the pixel amplifiers becomes a significant limitation. As many imaging technologies and applications demand smaller and smaller pixel pitches, there is a desire to minimize the area consumed by the pixel amplifiers.

SUMMARY

The forgoing features and elements may be combined in various combinations without exclusivity, unless expressly indicated herein otherwise. These features and elements as well as the operation of the disclosed embodiments will become more apparent in light of the following description and accompanying drawings.

A pixel master-slave photodiode bias control amplifier system is disclosed. The system may include a master pixel including a detector configured to receive an input illumination energy and direct a detector current to an amplification member in response to the input illumination energy. The amplification member may be configured to receive the detector current and direct a first amplification current through an integrator. The system may also include a first slave pixel connected to the amplification member of the master pixel.

A pixel master-slave photodiode bias control amplifier system is disclosed. The system may include a master pixel having a detector configured to receive an input illumination energy and direct a detector current to an amplification member in response to the input illumination energy. Moreover, the amplification member may be configured to receive the detector current and direct a first amplification current through an integrator. The system may include a first slave pixel connected to the amplification member of the master pixel, wherein the amplification member comprises a Sackinger current mirror, and wherein the master pixel further includes an amplifier load member configured to set a load of the amplification member in response to a bias voltage. The first slave pixel may include a slave detector configured to receive the input illumination energy and direct a slave detector current to a slave control transistor in response to the input illumination energy. The slave control transistor may be configured to receive the slave detector current and direct a first slave amplification current through a slave integrator. A gate of the slave control transistor may be connected to the amplification member of the master pixel.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice embodiments of the disclosure, it should be understood that other embodiments may be realized and that logical changes and adaptations in design and construction may be made in accordance with this invention and the teachings herein. Thus, the detailed description herein is presented for purposes of illustration only and not limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Furthermore, any reference to singular includes plural embodiments, and any reference to more than one component or step may include a singular embodiment or step. Surface shading lines may be used throughout the figures to denote different parts but not necessarily to denote the same or different materials.

As used herein, an "input illumination energy" may be in form of electromagnetic radiation. In various embodiments, the input illumination energy is a collimated light, such as laser light. In further embodiments, the input illumination energy is any type of electromagnetic radiation, such as gamma rays, ultraviolet light, infrared light, x-rays, or any other electromagnetic radiation.

Figure 1:
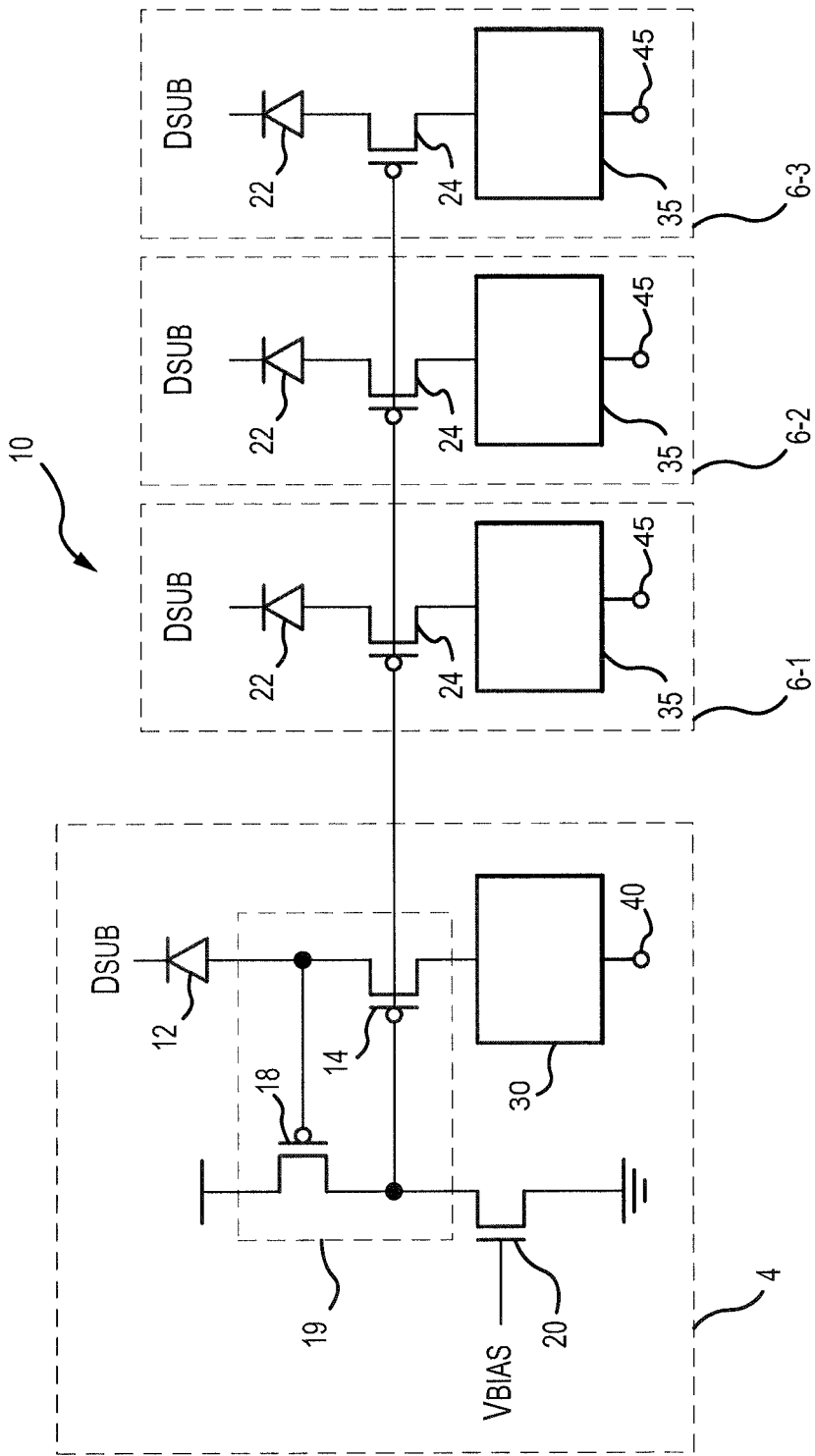
FIG. 1 illustrates a master-slave pixel system having a master pixel and one or more slave pixels according to various embodiments.

Traditional pixel amplifiers incorporate five transistors arranged in a differential amplifier configuration. However, as pixel counts increase in devices, the pixel amplifiers occupy increasing space and are associated with increasing amounts of power. Various approaches to address these challenges are disclosed herein. With reference to FIG. 1, a pixel master-slave photodiode bias control amplifier system 10 is disclosed. A pixel master-slave photodiode bias control amplifier system 10 may include a master pixel 4 and one or more slave pixel, such as slave pixels 6-1, 6-2, and 6-3. As such, multiple pixels may share components, decreasing the space and power allocated for pixel amplifiers in a device.

For example, a pixel master-slave photodiode bias control amplifier system 10 may comprise a master pixel 4 and a first slave pixel 6-1, a second slave pixel 6-2, and a third slave pixel 6-3. In further embodiments, any number of slave pixels are implemented, such as one master pixel and one slave pixel, or two slave pixels, or four slave pixels, or five slave pixels, or six slave pixels or any number of slave pixels as desired. The master pixel 4 may comprise an amplifier load member 20 and an amplification member 19. Amplifier load member 20 may set a conductivity of the amplification member 19. The amplification member 19 may be connected to a detector 12. The detector 12 may direct a detector current to the amplification member 19 having a magnitude corresponding to the magnitude of an input illumination energy, such as incipient light. The amplification member 19 may receive the detector current and may impel a first amplification current through an integrator 30 for further conditioning. Thus, the master pixel 4 may comprise an amplifier load member 20, an amplification member 19, a detector 12, and an integrator 30.

Turning to the different aspects of the master pixel 4 in detail, the detector 12 may convert an input illumination energy, such as photons from a source of infrared ("IR") radiation, into an electrical signal. The detector 12 may be electrically connected to the amplification member 19. The detector 12 may comprise a light sensing diode having an anode and a cathode. The light sensing diode may be reverse biased by a voltage, $D_{SUB}$, and may conduct a current in response to the presence of an input illumination energy.

The amplification member 19 may comprise a control transistor 14 and a feedback transistor 18. The amplification member 19 may comprise a two-transistor Sackinger current mirror. The amplification member 19 may replace the traditional five-transistor differential amplifier used in prior-art pixels amplifiers. As such, the space occupied by the master pixel 4 may be diminished relative to prior-art pixel amplifiers, and the current consumed may further be diminished (for example, less than about 1 nA of current compared to 50-100 nA for typical five transistor differential amplifiers). The amplification member 19 may form an active feedback loop whereby a substantially constant bias voltage may be maintained across the detector 12.

The amplifier load member 20 may comprise a transistor having a gate connected to a bias voltage, V-bias, a source connected to a ground, and a drain connected to the amplification member 19. For instance, the drain of the amplifier load member 20 may be connected in series with the drain-source path of feedback transistor 18. In response to the magnitude of the bias voltage, V-bias, the amplifier load member 20 may bias the feedback transistor 18 more toward having a fully conductive drain source-path or more toward having a fully non-conductive drain-source path. More specifically, the voltage on the drain of the feedback transistor 18 is set in response to the bias voltage, V-bias, so that the potential difference between the drain and gate of the feedback transistor 18 corresponding to a desired drain-source conductivity thus corresponds to different gate voltages depending on the chosen V-bias. In turn, the responsiveness of the amplification member 19 to a given magnitude of current from the detector 12 is varied in correspondence to V-bias.

The master pixel 4 may further comprise an integrator 30. The integrator 30 may generate an output voltage on a pixel output 40 in response to amplification member 19. Various aspects of an integrator 30 will be discussed further herein.

As depicted in FIG. 1, slave pixels 6-1, 6-2, 6-3, are connected to the amplification member 19. Thus, in this manner, the slave pixels 6-1, 6-2, 6-3, share at least a portion of the amplification member 19 of the master pixel 4. As such, multiple pixels may share amplifier components.

Turning in detail now to various aspects of slave pixels 6-1, 6-2, and 6-3, a slave pixel may include a slave detector 22, a slave control transistor 24, and a slave integrator 35. A slave pixel may respond to the magnitude of an input illumination energy present at the slave detector 22. Because the slave pixel is connected to the amplification member 19 of the master pixel 4, the responsiveness of the slave pixel to the input illumination energy is established in response to the master pixel 4. For instance, V-bias, via amplifier load member 20, sets the bias point of the amplification member 19, by setting a drain voltage of feedback transistor 18. However as illustrated in FIG. 1, control transistor 14 is situated similarly to each slave control transistor 24 of each slave pixel 6-1, 6-2, 6-3. As such, the bias point of each slave pixel is also set in response to the amplifier load member 20 of the master pixel 4 in a manner similar to the setting of the bias point of the control transistor 14. The slave detector 22 may direct a slave detector current to the slave control transistor 24 having a magnitude corresponding to the magnitude of the input illumination energy. The slave control transistor 24 may receive the slave detector current and may impel a first slave amplification current through a slave integrator 35 for further conditioning.

Each slave pixel 6-1, 6-2, and 6-3 may comprise a slave detector 22. The slave detector 22 may convert an input illumination energy, such as photons from a source of infrared ("IR") radiation, into an electrical signal. The slave detector 22 may be electrically connected to the slave control transistor 24. In various embodiments, one may appreciate that the interconnection of the slave detector 22 to the slave control transistor 24 is similar to the interconnection of the detector 12 to the control transistor 14 of the amplification member 19. The slave detector 22 may comprise a light sensing diode having an anode and a cathode. The light sensing diode may be reverse biased by a voltage, $D_{SUB}$, and may conduct an current in response to the presence of an input illumination energy.

A slave pixel 6-1, 6-2, and/or 6-3 may further comprise a slave integrator 35. The slave integrator 35 may be interconnected in series with a drain-source path of the slave control transistor 24 similarly to the interconnection in series of a drain source path of the control transistor 14 of the amplification member 19 to the integrator 30. The slave integrator 35 may respond to a current passing through the drain-source path of the slave control transistor 24 that is representative of the magnitude of the input illumination energy present at the slave detector 22. The slave integrator 35 may respond by generating a corresponding voltage at a pixel output 45 of the slave pixel. This voltage may represent the magnitude of the input illumination energy present at the slave detector 22.

Thus, one may appreciate that as the master pixel 4 may comprise an integrator 30, each slave pixel 6-1, 6-2, and 6-3 may each comprise a slave integrator 35. Moreover, various integrators 30 and slave integrators 35 may have various different architectures and various master pixels 4 and slave pixels 6-1, 6-2, 6-3 may comprise different combinations of integrator 30 architecture and slave integrator 35 architecture within a pixel master-slave photodiode bias control amplifier system 10.

Figure 3:
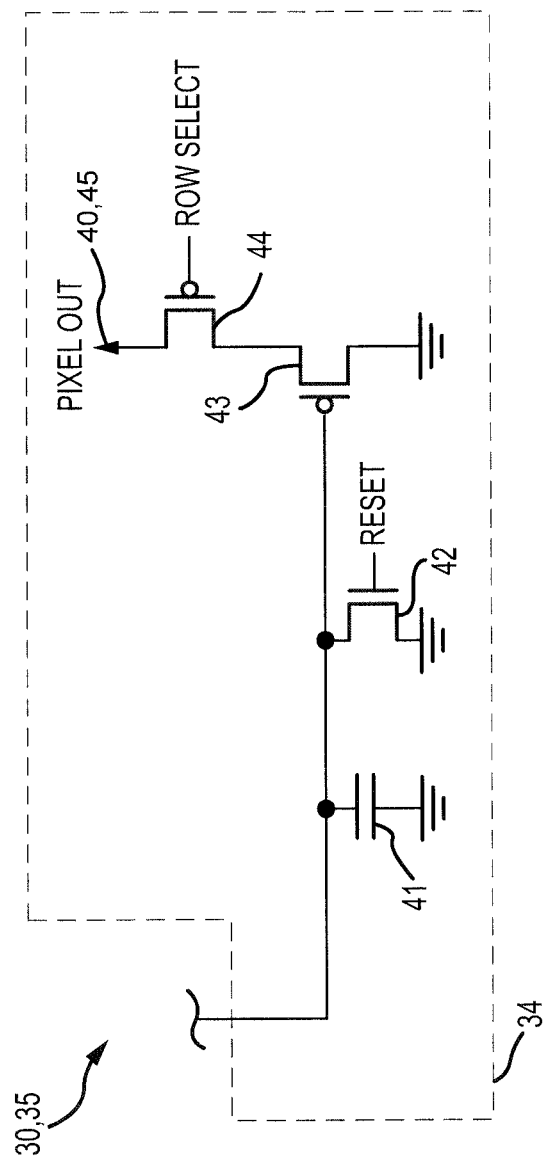
FIG. 3 illustrates various aspects of an integrating capacitor circuit of a pixel master-slave photodiode bias control amplifier according to various embodiments.

For instance, with reference to FIGS. 1 and 3, an integrator 30 and/or a slave integrator 35 may comprise a standalone integrating capacitor circuit 34. A standalone integrating capacitor circuit 34 may produce an output voltage corresponding to the integral of a current, such as may be corresponding to the integral of the current passing through the drain-source path of an injection transistor and that is representative of the magnitude of an input illumination energy present at a detector.

Figure 2:
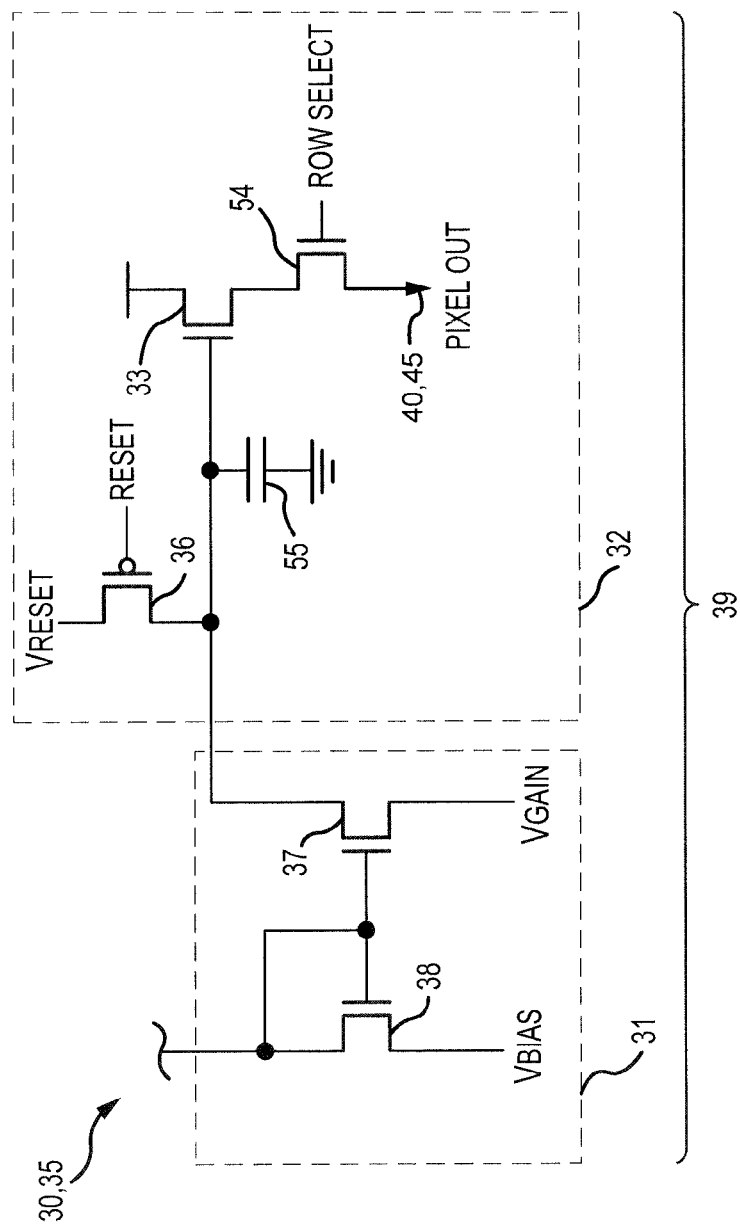
FIG. 2 illustrates various aspects of a gate-modulating current mirror amplifier of a pixel master-slave photodiode bias control amplifier according to various embodiments.

With reference to FIGS. 1 and 2, an integrator 30 and/or a slave integrator 35 may comprise a gate-modulating current mirror amplifier 39. A gate-modulating current mirror amplifier 39 may combine aspects of the standalone integrating capacitor circuit 34 (FIG. 3) with aspects of a current mirror (current mirror section 31), such as to provide enhanced isolation and linearity and/or other characteristics.

Upon comparison of FIG. 3 and FIG. 2, one may appreciate that the aspects of the standalone integrating capacitor circuit 34 may be incorporated into the gate-modulating current mirror amplifier 39 as an integrating capacitor circuit section 32, but may include a polarity inversion, such as so that p-channel transistors become n-channel transistors (and vis-a-versa) and so that certain voltages become grounds and grounds become voltages as depicted, such as to accommodate the introduction of the current mirror section 31.

Turning in more detail to FIGS. 1 and 2, a gate-modulating current mirror amplifier 39 may comprise a current mirror section 31 and an integrating capacitor circuit section 32. The current mirror section 31 may produce a mirror current corresponding to an input current. The current mirror section 31 may comprise a biased transistor 38 and a gain transistor 37. The biased transistor 38 may receive an input current, such as from a control transistor 14 of a master pixel 4, or from a slave control transistor 24 of a slave pixel 6-1, 6-2, and 6-3 depending on whether the integrator 30, 35 is implemented in a master pixel 4 or a slave pixel 6-1, 6-2, 6-3. The biased transistor 38 may drive a gain transistor 37 to such a conductivity that an equivalent (or corresponding, but scaled up or down) current passes through a drain-source path of the gain transistor 37. The drain-source path of the gain transistor 37 may be connected to an integrating capacitor circuit section 32. The integrating capacitor circuit section 32 may integrate the magnitude of this current over time and output a corresponding current or voltage on pixel output 40, 45.

The integrating capacitor circuit section 32 may comprise a row select transistor 54, an output transistor 33, an integrator 55 and a reset transistor 36. The integrator 55 may comprise a capacitor. One terminal of the capacitor may be connected to the source (or drain) of a gain transistor 37 of the current mirror section 31 and the other terminal may be connected to a ground. Thus, as current flows through the drain-source path of the gain transistor 37, a potential difference is induced across the terminals of the integrator 55 corresponding to the integral of the current. This potential difference may be read by the output transistor 33. For instance, the integrator 55 may be connected to the gate of the output transistor 33. As such, the conductivity of the drain-source path of the output transistor 33 may be varied in response to the potential difference induced across the terminals of the integrator 55. In various embodiments, a reset transistor 36 is also connected to the same terminal of the integrator 55 as output transistor 33. The reset transistor 36 may be activated by a reset voltage, such as in order to zero and restart the integration by the integrator 55. Finally, a row select transistor 54 may comprise a transistor comprising a drain-source path connected in series with the drain-source path of the output transistor 33. The row select transistor 54 may selectively connect and disconnect the drain-source path of the output transistor 33 to a pixel output 40, 45. In this manner, the pixel output 40, 45 may selectively be enabled and disabled.

Turning now to FIGS. 1 and 3, an integrator 30 and/or a slave integrator 35 may comprise a standalone integrating capacitor circuit 34. A standalone integrating capacitor circuit 34 may be similar to the integrating capacitor circuit section 32 of the gate-modulating current mirror amplifier 39, except with various components having opposite polarity.

For example, the standalone integrating capacitor circuit 34 may comprise a row select transistor 44, an output transistor 43, an integrator 41, and a reset transistor 42.

The integrator 41 may comprise a capacitor. One terminal of the capacitor may receive a current, such as from a control transistor 14 of a master pixel 4 or from a slave control transistor 24 of a slave pixel 6-1, 6-2, or 6-3. The other terminal of the capacitor may be connected to a ground. Thus, as current flows into an integrator 30 and/or a slave integrator 35, a potential difference is induced across the terminals of the integrator 41 corresponding to the integral of the current. This potential difference may be read by the output transistor 43. For instance, the integrator 41 may be connected to the gate of the output transistor 43. As such, the conductivity of the drain-source path of the output transistor 43 may be varied in response to the potential difference induced across the terminals of the integrator 41. In various embodiments, a reset transistor 42 is also connected to the same terminal of the integrator 41 as the gate of the output transistor 43. The reset transistor 42 may be activated by a reset voltage, such as to zero and restart the integration by the integrator 41. Finally, a row select transistor 44 may comprise a transistor comprising a drain-source path connected in series with the drain-source path of the output transistor 43. The row select transistor 44 may selectively connect and disconnect the drain-source path of the output transistor 43 to a pixel output 40, 45. In this manner, the pixel output 40, 45 may selectively be enabled and disabled.

Various benefits and advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A pixel master-slave photodiode bias control amplifier system comprising:
    a master pixel comprising:
        a detector configured to receive an input illumination energy and direct a detector current to an amplification member in response to the input illumination energy; and
        an amplifier load member configured to set a load of the amplification member in response to a bias voltage,
        the amplification member configured to receive the detector current and direct a first amplification current through an integrator, and
        the amplification member comprising a current mirror; and
    a first slave pixel connected to the amplification member of the master pixel.

2. The pixel master-slave photodiode bias control amplifier system according to claim 1, wherein the amplification member comprises a Sackinger current mirror.

3. The pixel master-slave photodiode bias control amplifier system according to claim 1, wherein the integrator comprises a gate-modulating current mirror amplifier.

4. The pixel master-slave photodiode bias control amplifier system according to claim 1, wherein the integrator comprises an integrating capacitor circuit.

5. The pixel master-slave photodiode bias control amplifier system according to claim 1, wherein the input illumination energy comprising collimated light.

6. The pixel master-slave photodiode bias control amplifier system according to claim 5, wherein the detector comprises a reverse biased light sensitive diode comprising an anode and a cathode.

7. The pixel master-slave photodiode bias control amplifier system according to claim 1, wherein the first slave pixel comprises:
    a slave detector configured to receive the input illumination energy and direct a slave detector current to a slave control transistor in response to the input illumination energy,
    the slave control transistor configured to receive the slave detector current and direct a first slave amplification current through a slave integrator,
    wherein a gate of the slave control transistor is connected to the amplification member of the master pixel.

8. The pixel master-slave photodiode bias control amplifier system according to claim 7, wherein the slave integrator comprises a gate-modulating current mirror amplifier.

9. The pixel master-slave photodiode bias control amplifier system according to claim 7, wherein the slave integrator comprises an integrating capacitor circuit.

10. The pixel master-slave photodiode bias control amplifier system according to claim 1, further comprising a second slave pixel and a third slave pixel each connected to the amplification member of the master pixel.

11. A pixel master-slave photodiode bias control amplifier system comprising:
    a master pixel comprising a detector configured to receive an input illumination energy and direct a detector current to an amplification member in response to the input illumination energy,
    the amplification member configured to receive the detector current and direct a first amplification current through an integrator;
    a first slave pixel connected to the amplification member of the master pixel,
    wherein the amplification member comprises a Sackinger current mirror,
    wherein the master pixel further comprises an amplifier load member configured to set a load of the amplification member in response to a bias voltage, and
    wherein the first slave pixel comprises:
        a slave detector configured to receive the input illumination energy and direct a slave detector current to a slave control transistor in response to the input illumination energy,
        the slave control transistor configured to receive the slave detector current and direct a first slave amplification current through a slave integrator,
        wherein a gate of the slave control transistor is connected to the amplification member of the master pixel.

12. The pixel master-slave photodiode bias control amplifier system according to claim 11, wherein the integrator comprises one of: a gate-modulating current mirror amplifier and an integrating capacitor circuit.

13. The pixel master-slave photodiode bias control amplifier system according to claim 12, wherein the slave integrator comprises one of: a gate-modulating current mirror amplifier and an integrating capacitor circuit.

14. The pixel master-slave photodiode bias control amplifier system according to claim 11, further comprising a second slave pixel and a third slave pixel each connected to the amplification member of the master pixel.

* * * * *